United States Patent [19]
Carvajal

[11] Patent Number: 5,276,358
[45] Date of Patent: Jan. 4, 1994

[54] CIRCUITRY AND METHOD FOR CONTROLLING VOLTAGE IN AN ELECTRONIC CIRCUIT

[75] Inventor: Fernando D. Carvajal, McKinney, Tex.

[73] Assignee: Texas Instruments Incorporated, Dallas, Tex.

[21] Appl. No.: 787,853

[22] Filed: Nov. 5, 1991

[51] Int. Cl.[5] ..................... H03K 5/19; G01R 19/12
[52] U.S. Cl. ..................... 307/517; 307/263; 307/296.6; 328/114; 328/132; 328/185
[58] Field of Search ............ 307/517, 263, 552, 553, 307/270, 273, 296.6, 546, 547, 549; 328/114, 132, 185

[56] References Cited

U.S. PATENT DOCUMENTS

| | | | |
|---|---|---|---|
| 3,569,735 | 3/1971 | Lavender | 328/185 |
| 4,958,093 | 9/1990 | Kosson et al. | 307/546 |
| 4,992,677 | 2/1991 | Ishibashi et al. | 307/552 |
| 5,126,588 | 6/1992 | Reichmeyer et al. | 307/270 |

FOREIGN PATENT DOCUMENTS 0119317  5/1988  Japan ........................ 307/263

OTHER PUBLICATIONS

"A Triple Low-side Driver Power IC with Regulation and Microprocessor Interface Control", PESC, Jun., 1991., Thiel et al.

*Primary Examiner*—Timothy P. Callahan
*Attorney, Agent, or Firm*—Richard L. Donaldson; Stanton C. Braden

[57] ABSTRACT

A method and circuitry are provided for controlling voltage in an electronic circuit. Sensing circuitry coupled to an output node senses a rate of change in an output voltage of the output node and outputs a signal in response thereto. Amplification circuitry coupled to the sensing circuitry receives the signal and outputs an amplified signal in response thereto. Modification circuitry coupled between the amplification circuitry and the output node receives the amplified signal and modifies the rate of change in response to the amplified signal.

34 Claims, 3 Drawing Sheets

CIRCUITRY AND METHOD FOR CONTROLLING VOLTAGE IN AN ELECTRONIC CIRCUIT

TECHNICAL FIELD OF THE INVENTION

This invention relates in general to electronic circuits, and more particularly to a method and circuitry for controlling voltage in an electronic circuit.

BACKGROUND OF THE INVENTION

Advancement in integrated circuit technology has lead to increased numbers of electronic circuits being located in very close proximity to each other within a system. Radio frequency interference (RFI) results when output voltages rise and fall quickly in response to voltage inputs. Radio frequency interference in an electronic circuit may negatively impact the proper operation of adjacent electronic circuitry. Consequently, as increased numbers of electronic circuits are located in very close proximity to each other, the negative consequences of RFI are multiplied.

For example, a light emitting diode (LED) lamp driver circuit may use a duty cycle controller to dim a brightness level of the lamp, such that the lamp is repeatedly switched on for only a specified percentage of an incremental time unit. The incremental time unit may be very small, resulting in the lamp voltage being repeatedly switched at a high frequency in order to properly execute the duty cycle over several time units and to thereby dim the lamp. Such high frequency switching in the lamp driver circuit may cause undesired RFI which negatively impacts the proper operation of adjacent electronic circuitry. In this example, RFI may be reduced by controlling the rise and fall times of voltages output by the lamp driver circuit in response to the repeatedly switched voltage inputs provided by the duty cycle controller.

Previous approaches have utilized digital circuitry to slow the rise and fall times of output voltages. However, these digital approaches typically fail to slow the output voltage response as extensively as desired for various applications. Other approaches incorporate analog circuitry to slow the rise and fall times of an output voltage. However, typical analog approaches incorporate a capacitor having high capacitance for monitoring the rate of output voltage response. The large amount of integrated circuit area occupied by such a high capacitance capacitor is undesirable in various applications. Moreover, many previous approaches produce inconsistent rise and fall times that significantly vary according to temperature and fabrication conditions.

Therefore, a need has arisen for a method and circuitry for controlling voltage in an electronic circuit, such that radio frequency interference is reduced, such that integrated circuit area is minimized, and such that consistent rise and fall times are produced despite variations in temperature and fabrication conditions.

SUMMARY OF THE INVENTION

In a method and circuitry for controlling voltage in an electronic circuit, sensing circuitry coupled to an output node senses a rate of change in an output voltage of the output node and outputs a signal in response thereto. Amplification circuitry coupled to the sensing circuitry receives the signal and outputs an amplified signal in response thereto. Modification circuitry coupled between the amplification circuitry and the output node receives the amplified signal and modifies the rate of change in response to the amplified signal.

It is a technical advantage of this aspect of the present invention that radio frequency interference in an electronic circuit is reduced.

It is a further technical advantage of this aspect of the present invention that integrated circuit area is minimized.

It is yet another technical advantage of this aspect of the present invention that consistent rise and fall times of an output voltage are produced despite variations in temperature and fabrication conditions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Preferred embodiments of the present invention and their advantages are best understood by referring to FIGS. 1-6 of the drawings, like numerals being used for like and corresponding parts of the various drawings.

Figure 1:
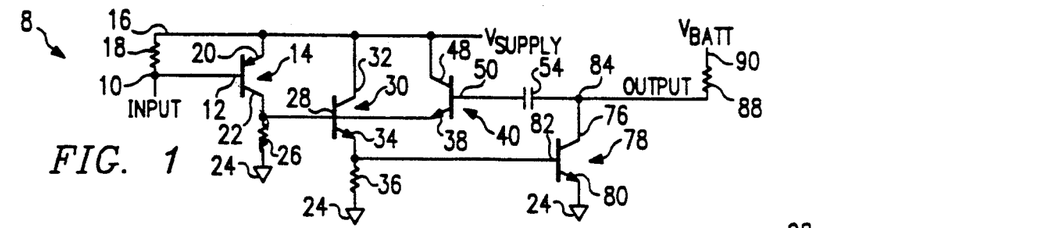
FIG. 1 illustrates circuitry for controlling a rise time of voltage in an electronic circuit.

FIG. 1 illustrates circuitry 8 for controlling a rise time of voltage in an electronic circuit. An input terminal 10 is coupled to a base 12 of a pnp transistor 14 and to a supply voltage 16 through a resistor 18. Pnp transistor 14 has an emitter 20 coupled to a supply voltage 16 and has a collector 22 coupled to a ground line 24 through a resistor 26. Supply voltage 16 has a voltage of approximately five volts relative to the voltage of ground line 24. Collector 22 is also coupled to a base 28 of an npn transistor 30. Transistor 30 has a collector 32 coupled to supply voltage 16 and has an emitter 34 coupled to ground line 24 through a resistor 36. Base 28 of transistor 30 is also coupled to an emitter 38 of an npn transistor 40. A collector 48 of npn transistor 40 is coupled to supply voltage 16. Transistor 40 has a base 50 coupled through a capacitor 54 to a collector 76 of an npn transistor 78. An emitter 80 of npn transistor 78 is coupled to ground line 24, and a base 82 of npn transistor 78 is coupled to emitter 34 of transistor 30. An output terminal 84 is coupled to collector 76 of transistor 78 and is also coupled through a load resistor 88 to a battery voltage 90. Voltage at output terminal 84 is measured relative to ground line 24.

When a high voltage is applied to input terminal 10 near the voltage of supply voltage 16, current to base 12 of transistor 14 decreases, thereby decreasing current to base 28 of modification transistor 30 and to base 82 of output transistor 78, which consequently increases voltage at output terminal 84. Since sense current flows through sensing capacitor 54 according to i=C dv/dt, the positive change in voltage at output terminal 84 results in sense current flow through sensing capacitor 54 away from output terminal 84 to base 50 of amplification transistor 40, thereby amplifying current from emitter 38 of amplification transistor 40 to base 28 of modification transistor 30 and consequently attenuating the rate of current decrease at base 28 of modification transistor 30. As the rate of current decrease at base 28 of transistor 30 is attenuated, the rate of decrease in modification current at base 82 of output transistor 78 is also attenuated, thereby attenuating the rate of voltage increase at output terminal 84. Thus, if voltage at output terminal 84 increases, then the circuitry of FIG. 1 attenuates the rate of decrease in modification current at base 82 of output transistor 78, such that dv/dt at output terminal 84 is reduced.

In an important aspect of the preferred embodiment, amplified current from emitter 38 of amplification transistor 40 is $\beta$ times greater than sense current at base 50 of amplification transistor 40, thereby reducing the size of sensing capacitor 54 necessary to appropriately slow dv/dt rise times at output terminal 84, since sense current flows through sensing capacitor 54 according to i=C dv/dt. By reducing the size of sensing capacitor 54, layout area is significantly reduced by approximately 2 orders of magnitude. For example, in a typical previous approach, a 1000 picofarad (pf) capacitor is required to create sufficient sense current to adequately control dv/dt of an output terminal. The 1000 pf capacitor occupies approximately 2000 square thousandths of an inch (2000 mil$^2$). In FIG. 1, sensing capacitor 54 has a capacitance of 5 pf when used in combination with amplification transistor 40. A 5 pf capacitor occupies only approximately 10 mil$^2$, and transistor 40 occupies only approximately 15 mil$^2$, thereby reducing layout area considerably when compared against 2000 mil$^2$.

Figure 2:
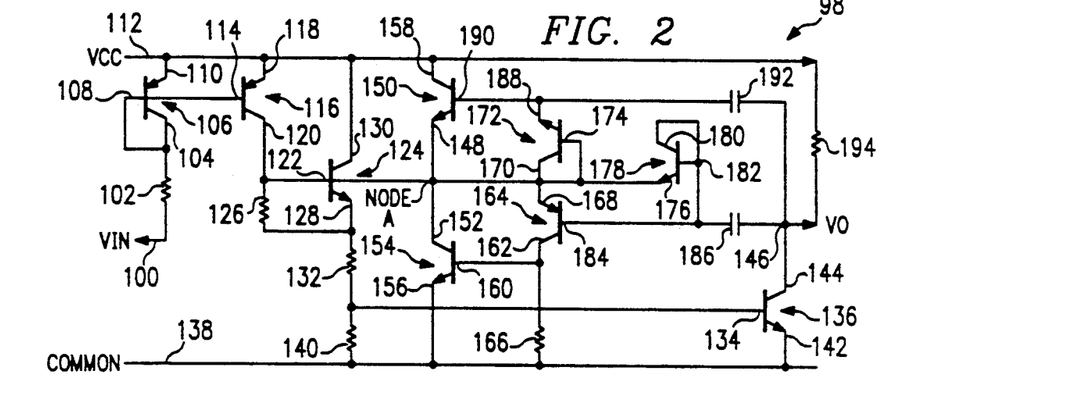
FIG. 2 illustrates a first illustrative embodiment of circuitry for controlling both rise and fall times of voltage in an electronic circuit.

FIG. 2 illustrates a first illustrative embodiment of circuitry 98 for controlling both rise and fall times of voltage in an electronic circuit. An input terminal 100 is coupled through a resistor 102 to a collector 104 of a pnp transistor 106. A base 108 of transistor 106 is coupled to collector 104. An emitter 110 of transistor 106 is coupled to a $V_{cc}$ 112 having a voltage of approximately twelve volts relative to the voltage of a ground line 138. Base 108 of transistor 106 is further coupled to a base 114 of a pnp transistor 116. An emitter 118 of transistor 116 is coupled to $V_{cc}$ 112. A collector 120 of transistor 116 is coupled to a base 122 of an npn transistor 124. Base 122 of transistor 124 is coupled through a resistor 126 to an emitter 128 of transistor 124. A collector 130 of transistor 124 is coupled to $V_{cc}$ 112. Emitter 128 of transistor 124 is coupled through a resistor 132 to a base 134 of an npn transistor 136. Base 134 of transistor 136 is coupled to ground line 138 through a resistor 140. An emitter 142 of transistor 136 is also coupled to ground line 138. A collector 144 of transistor 136 is coupled to an output terminal 146 which is measured relative to ground line 138.

Base 122 of transistor 124 is coupled to Node A, which is also coupled to an emitter 148 of an npn transistor 150 and to a collector 152 of an npn transistor 154. An emitter 156 of transistor 154 is coupled to ground line 138. A collector 158 of transistor 150 is coupled to $V_{cc}$ 112. A base 160 of transistor 154 is coupled to a collector 162 of a pnp transistor 164 and through a resistor 166 to ground line 138. An emitter 168 of transistor 164 is coupled to Node A, to a collector 170 of an npn transistor 172, to a base 174 of transistor 172, and to an emitter 176 of an npn transistor 178. A collector 180 of transistor 178 is coupled to a base 182 of transistor 178, to a base 184 of transistor 164, and through a capacitor 186 to output terminal 146. An emitter 188 of transistor 172 is coupled to a base 190 of transistor 150 and through a capacitor 192 to output terminal 146. Output terminal 146 is further coupled through a resistor 194 to $V_{cc}$ 112.

In the preferred embodiment, resistor 102 has a value of approximately 10 kilo-ohms, resistor 126 has a value of approximately 50 kilo-ohms, resistor 132 has a value of approximately 440 ohms, resistor 140 has a value of approximately 5 kilo-ohms, resistor 166 has a value of approximately 50 kilo-ohms, and resistor 194 has a value of approximately 11 ohms. Also, in the preferred embodiment, transistor 116 is approximately eleven times larger than transistor 106, transistor 124 is approximately forty times larger than transistor 106, and transistor 136 is approximately eight hundred times larger than transistor 106. All other transistors in FIG. 2 are approximately four times larger than transistor 106.

When a low voltage is applied to input terminal 100 near the voltage of ground line 138, transistor 106 is turned on, and approximately 1 milliamp of current passes through resistor 102. Since base 114 of transistor 116 is coupled to base 109 of transistor 106, transistor 116 is also turned on, and transistor 116 accordingly functions as a current mirror amplifier based upon the relative sizes of transistor 116 and transistor 106. Thus, current through collector 120 of transistor 116 is approximately eleven milliamps, which consequently increases voltage at Node A. By using transistor 116 as a current amplifier between input terminal 100 and Node A, voltage at Node A may be adjusted to control rise and fall times of voltage at output terminal 146; otherwise, if Node A was simply connected to a switched voltage input at input terminal 100, then a controlled impedance at Node A would be more difficult to achieve.

As voltage at Node A increases, current to base 122 of modification transistor 124 increases, thereby increasing modification current to base 134 of output transistor 136 and consequently decreasing the voltage at output terminal 146. As the voltage at output terminal 146 decreases, sense current flows toward output terminal 146 through sense capacitor 186 and through base 184 of amplification transistor 164, thereby amplifying current provided from collector 162 of amplification transistor 164 to base 160 of additional amplification transistor 154. As current at base 160 increases, the rate of voltage increase at Node A is attenuated, thereby attenuating the rate of current increase at emitter 128 of modification transistor 124 and consequently attenuating the rate of modification current increase at base 134 of output transistor 136, resulting in reduced dv/dt at terminal 146. Thus, if a negative rate of change in voltage at output terminal 146 occurs, then the circuitry of FIG. 2 attenuates the rate of modification current increase at base 134 of output transistor 136, such that dv/dt at output terminal 146 is reduced.

When a high voltage of approximately twelve volts is applied to input terminal 100, transistors 106 and 116 are turned off, thereby decreasing voltage at Node A. As voltage at Node A decreases, current to base 122 of modification transistor 124 decreases, thereby decreasing modification current to base 134 of output transistor 136 and consequently resulting in a positive rate of change in the voltage at output terminal 146. As voltage at output terminal 146 increases, sense current flows away from output terminal 146 through sense capacitor 192 to base 190 of amplification transistor 150, thereby amplifying current provided from emitter 148 of amplification transistor 150 to base 122 of transistor 124, which consequently attenuates the rate of current decrease at base 122 of transistor 124. By attenuating the rate of current decrease at base 122 of transistor 124, the rate of modification current decrease at base 134 of output transistor 136 is also attenuated, such that dv/dt at output terminal 146 is reduced.

Current at base 122 of transistor 124 is affected both by increasing dv/dt at output terminal 146 and by decreasing dv/dt at output terminal 146. When dv/dt increases at output terminal 146, the rate of current decrease at base 122 of modification transistor 124 is attenuated by sense capacitor 192 in combination with amplification transistor 150. When dv/dt decreases at output terminal 146, the rate of current increase at base 122 of modification transistor 124 is attenuated by sense capacitor 186 in combination with amplification transistors 154 and 164. Sense capacitor 192 has no significant effect on fall times when dv/dt at output terminal 146 is negative. Similarly, sense capacitor 186 has no significant effect on rise times when dv/dt at output terminal 146 is positive.

Thus, sense capacitor 186 controls fall times of voltage at output terminal 146, while sense capacitor 192 controls rise times of voltage at output terminal 146. Amplification transistor 150 amplifies sense current provided by sense capacitor 192 to attenuate the rate of current decrease at base 122 of transistor 124, thereby reducing the size of sense capacitor 192 necessary to adequately control rise times of voltage at output terminal 146. Similarly, amplification transistors 154 and 164 amplify sense current through sense capacitor 186 to attenuate the rate of current increase at base 122 of transistor 124, thereby reducing the size of sense capacitor 186 necessary to adequately control fall times of voltage at output terminal 146. Consequently, in the preferred embodiment, sense capacitor 186 has a capacitance of approximately 2 pf, while sense capacitor 192 has a capacitance of approximately 5 pf. Each of transistors 150, 154, 172, 164 and 178 occupy approximately 15 mil$^2$. Capacitor 186 occupies approximately 4 mil$^2$, while capacitor 192 occupies approximately 10 mil$^2$. Thus, the combination of transistors 150, 154, 172, 164, and 178, along with capacitors 186 and 192, occupies a total area of approximately 89 mil$^2$, thereby reducing integrated circuit layout area considerably when compared against typical previous approaches having a capacitor occupying approximately 2,000 mil$^2$.

Transistors 172 and 178 function as diodes, providing a voltage potential of 2 $V_{be}$ (2×0.7 volts) between base 184 of transistor 164 and base 190 of transistor 150, such that voltage at Node A is substantially constrained to being no more than 0.7 volts ($V_{be}$) above voltage at base 190 of transistor 150, and such that voltage at Node A is substantially constrained to being no more that 0.7 volts ($V_{be}$) below voltage at base 184 of transistor 164. Consequently, the voltage difference between base 190 and emitter 148 of transistor 150 is substantially constrained to being no more than 1.4 volts (2 $V_{be}$) away from turning on transistor 150, and the voltage difference between emitter 168 and base 184 of transistor 164 is substantially constrained to being no more than 1.4 volts (2 $V_{be}$) away from turning on transistor 164, thereby limiting delays between a voltage transition at input terminal 100 and a resulting feedback control current through transistors 150 or 164.

Resistor 126 facilitates turn-off of transistor 124 when current decreases at base 122 of transistor 124, and resistor 166 facilitates turn-off of transistor 154 when current decreases at base 160, thereby diminishing the effects of current leakage between these transistors' respective collectors and bases. Resistor 102 assists in establishing an appropriate level of constant current through transistor 106. Resistors 132 and 140 impose operating limits on current through transistor 124; moreover, resistor 140 facilitates turn-off of output transistor 136 when current decreases at base 134. Additionally, resistor 132 increases the voltage potential between Node A and output terminal 146, resulting in larger voltage swings across capacitors 186 and 192 and consequently increasing current through capacitors 186 and 192 and thereby reducing their required capacitance values and sizes.

Figure 3:
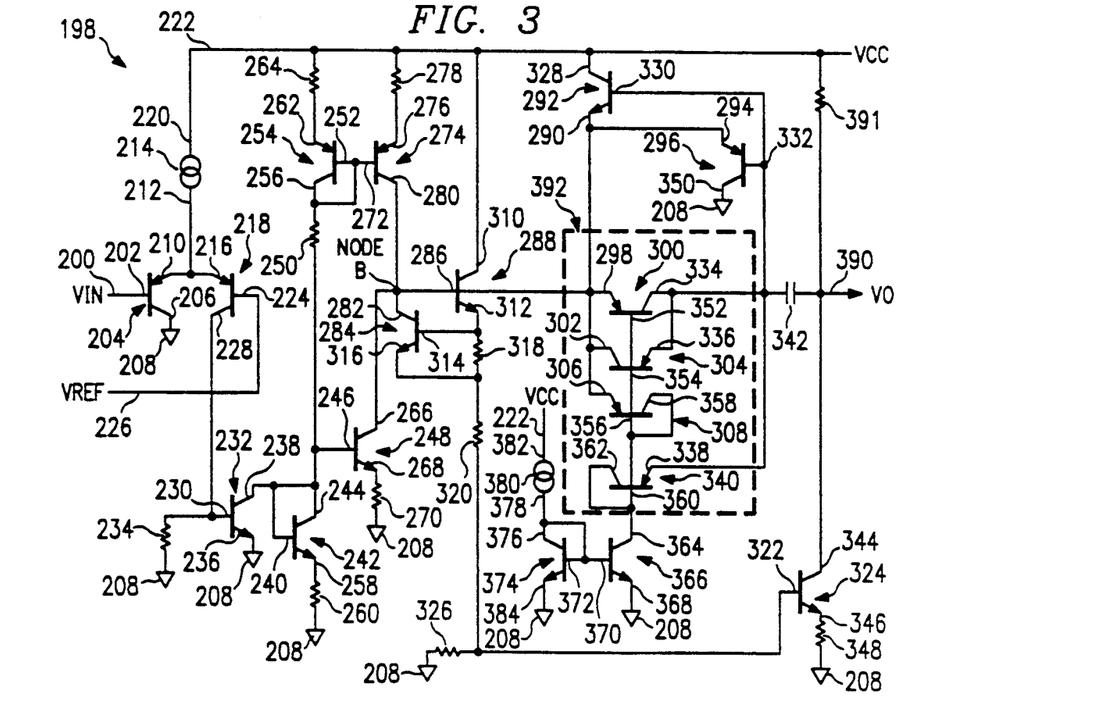
FIG. 3 illustrates a second illustrative embodiment of circuitry for controlling both rise and fall times of voltage in an electronic circuit.

In the circuitry of FIG. 2, two sense capacitors 186 and 192 are required, because two different current amplification paths are used to modify current at base 122 of transistor 124. FIG. 3 illustrates a second illustrative embodiment of circuitry 198 for controlling both rise and fall times of voltage in an electronic circuit. In the circuitry of FIG. 3, only one capacitor is required to control both rise and fall times of voltage at an output mode; hence, only one capacitor is required to be properly fabricated for the circuitry. In FIG. 3, an input terminal 200 is coupled to a base 202 of a pnp transistor 204. A collector 206 of transistor 204 is coupled to a ground line 208. An emitter 210 of transistor 204 is coupled to an output 212 of a preferably 25-microamp current source 214 and to an emitter 216 of a pnp transistor 218. An input 220 of current source 214 is coupled to a $V_{cc}$ 222 having a voltage of approximately 5 volts relative to the voltage of ground line 208. A base 224 of transistor 218 is coupled to a reference voltage node 226, and a collector 228 of transistor 218 is coupled to a base 230 of an npn transistor 232 and is also coupled through a resistor 234 to ground line 208. An emitter 236 of transistor 232 is coupled to ground line 208. A collector 238 of transistor 232 is coupled to a base 240 of an npn transistor 242, to a collector 244 of transistor 242, to a base 246 of an npn transistor 248, and through a resistor 250 both to a base 252 of a pnp transistor 254 and to a collector 256 of transistor 254. An emitter 258 of transistor 242 is coupled to ground line 208 through a resistor 260. An emitter 262 of transistor 254 is coupled to $V_{cc}$ 222 through a resistor 264. A collector 266 of transistor 248 is coupled to Node B, and an emitter 268 of transistor 248 is coupled to ground line 208 through a resistor 270. Base 252 of transistor 254 is coupled to a base 272 of a pnp transistor 274. An emitter 276 of transistor 274 is coupled to $V_{cc}$ 222 through a resistor 278, and a collector 280 of transistor 274 is coupled to Node B. Node B is further coupled to a collector 282 of an npn transistor 284, to a base 286 of an npn transistor 288, to an emitter 290 of an npn transistor 292, to an emitter 294 of a pnp transistor 296, to an emitter 298 of a pnp transistor 300, to a collector 302 of a pnp transistor 304, and to an emitter 306 of a pnp transistor 308.

A collector 310 of transistor 288 is coupled to $V_{cc}$ 222, and an emitter 312 of transistor 288 is coupled to a base 314 of transistor 284. Base 314 of transistor 284 is coupled to an emitter 316 of transistor 284 through a resistor 318. Emitter 316 of transistor 284 is coupled through a resistor 320 to a base 322 of an npn transistor 324. Base 322 of transistor 324 is coupled to ground line 208 through a resistor 326. A collector 328 of transistor 292 is coupled to $V_{cc}$ 222. A base 330 of transistor 292 is coupled to a base 332 of transistor 296, to a collector 334 of transistor 300, to an emitter 336 of transistor 304, to an emitter 338 of a pnp transistor 340, and through a capacitor 342 to a collector 344 of transistor 324. An emitter 346 of transistor 324 is coupled to ground line 208 through a resistor 348. A collector 350 of transistor 296 is coupled to ground line 208.

A base 352 of transistor 300 is coupled to a base 354 of transistor 304, to a base 356 of transistor 308, to a collector 358 of transistor 308, to a base 360 of is transistor 340, to a collector 362 of transistor 340, and to a collector 364 of an npn transistor 366. Collector 364 of transistor 366 may optionally be coupled to ground line 208 through a shunt capacitor (not shown). An emitter 368 of transistor 366 is coupled to ground line 208. A base 370 of transistor 366 is coupled to a base 372 of an npn transistor 374, to a collector 376 of transistor 374, and to an output 378 of a preferably one-microamp current source 380. An input 382 of current source 380 is coupled to $V_{cc}$ 222. An emitter 384 of transistor 374 is coupled to ground line 208. Collector 344 of transistor 324 is coupled to an output terminal 390 which is measured relative to ground line 208. Output terminal 390 is coupled through a resistor 391 to $V_{cc}$ 222. The voltage at output terminal 390 has an inverted logic state relative to the voltage at input terminal 200. Transistors 300, 304, 308 and 340 form a bilateral bipolar pnp transistor device 392 indicated by the dashed enclosure in FIG. 3.

In FIG. 3,, resistor 234 has a value of approximately 100 kilo-ohms, resistor 260 has a value of approximately 2 kilo-ohms, resistor 250 has a value of approximately 25 kilo-ohms, resistor 264 has a value of approximately 1 kilo-ohm, resistor 278 has a value of approximately 1 kilo-ohm, resistor 270 has a value of approximately 1 kilo-ohm, resistor 318 has a value of approximately 66 ohms, resistor 320 has a value of approximately 150 ohms, resistor 326 has a value of approximately 1 kilo-ohm, resistor 348 has a value of approximately 0.018 ohms, resistor 391 has a value of approximately one kilo-ohm, capacitor 342 has a capacitance of approximately 100 picofarads, transistor 288 is approximately six times larger than transistor 204, and transistor 324 is approximately 1,370 times larger than transistor 204. All other transistors in FIG. 3 are approximately equal in size to transistor 204. In alternative embodiments, the resistance values of resistors, the sizes of transistors, the current values of current sources, and the voltages of supply voltages may all be increased or decreased, resulting in corresponding increases or decreases in integrated circuity layout area, power specifications, and overall circuit performance.

When a low voltage is applied to input terminal 200 lower than a voltage at reference voltage node 226, transistor 218 is turned off, resulting in voltage at base 230 of transistor 232 being approximately zero volts and consequently, turning off transistor 232. Transistors 254 and 274 together form a one-to-one current mirror, such that a current (I) continuously passes through collector 280 of transistor 274; moreover, a current (approximately I) continuously passes through collector 256 of transistor 254, and through resistor 250.

Thus, when transistor 232 is turned off, current (approximately I) through resistor 250 passes through emitter 258 of transistor 242 and through resistor 260. Transistors 242 and 248 together form a current mirror, in which a current (approximately I) passes through emitter 258 of transistor 242 and through resistor 260, and in which a current (approximately 2I) passes through emitter 268 of transistor 248 and through resistor 270. The current through resistor 270 is approximately twice the current through resistor 260, because resistor 270 has approximately one-half the resistance of 260, thereby requiring approximately twice as much current through resistor 270 in order to maintain a voltage at emitter 268 of transistor 248 equal to a voltage at emitter 258 of transistor 242. By maintaining a voltage at emitter 268 equal to a voltage at emitter 258, an appropriate $V_{be}$ (0.7 volts) is maintained for each of transistors 242 and 248 given that base 240 of transistor 242 is coupled to base 246 of transistor 248. Consequently, when transistor 232 is turned off, a current (approximately 2 I) passes through transistor 248, while a significantly lower current (approximately I) passes through transistor 274, such that total current at base 286 of transistor 288 is reduced.

When current is reduced at base 286 of transistor 288, current through emitter 312 of modification transistor 288 is also reduced, resulting in reduced modification current through base 322 of output transistor 324 and consequently increasing the voltage at output terminal 390. As voltage at output terminal 390 increases, sense current passes through sense capacitor 342 away from output terminal 390 to base 330 of amplification transistor 292, thereby supplying amplified current to base 286 of transistor 288 from emitter 290 of amplification transistor 292 and consequently reducing the positive rate of change in voltage at output terminal 390.

When a high voltage is applied to input terminal 200 above the voltage at reference voltage node 226, current passes through transistor 218, thereby turning on transistor 232. When transistor 232 is turned on, a low resistance path is formed through emitter 236 of transistor 232 to ground line 208, resulting in current (approximately I) passing from resistor 250 through emitter 236 of transistor 232, thereby substantially turning off transistors 242 and 248. When transistor 248 is turned off, voltage at Node B increases from current (approximately I) through collector 280 of transistor 274. When voltage at Node B is increased, current through emitter 312 of modification transistor 288 also increases, thereby increasing modification current through output transistor 324 and consequently reducing voltage at output terminal 390. As voltage at output terminal 390 decreases, sense current passes through sense capacitor 342 toward output terminal 390, resulting in amplification transistor 296 attenuating the rate of voltage increase at Node B in order to reduce the negative rate of change in voltage at output terminal 390.

Transistor 284 operates to limit current at base 286 of transistor 288, based upon current through emitter 312 of transistor 288; since transistor 288 is approximately six times larger than transistor 284, the limitation of current at base 286 of transistor 288 does not significantly impair the ability of transistor 288 to provide sufficient current to base 322 of output transistor 324. The use of transistor 284 instead of a resistor is preferred, because transistor 284 provides a constant pre-drive current limit over a wider range of voltages at $V_{cc}$ 222.

Resistor 318 provides the $V_{be}$ (9.7 volts) necessary to turn on transistor 284. Resistor 320 increases the voltage potential between Node B and output terminal 390, resulting in larger voltage swings across capacitor 342 in response to input terminal 200 being switched between high and low voltages; by having a larger voltage swing across capacitor 342 in response to input terminal 200 being switched between high and low voltages, the current through capacitor 342 is greater than it would otherwise be in the absence of resister 320, thereby reducing the capacitance value and size required for capacitor 342 to appropriately control current at base 286 of transistor 288, relative to the capacitance value and size required for capacitor 342 in the absence of resister 320. Resistor 326 provides $V_{be}$ necessary to turn on output transistor 324 and also facilitates turn-off of output transistor 324 when current decreases at base 322. Resistor 234 provides $V_{be}$ necessary to turn on transistor 232 and also facilitates turn-off of transistor 232 when current decreases at base 230. Resistor 250 facilitates proper regulation of current through transistor 254. Resistors 348 is an optional current sensing resistor, and resistor 391 simulates a load at output terminal 390. The large size of output transistor 324 increases its current drive capability. In the preferred embodiment, output transistor 324 may sink up to approximately one ampere of current.

Transistors 300, 304, 308, and 340 together form a bilateral bipolar pnp transistor devices 392 between Node B and capacitor 342. Transistors 374 and 366 together form a bilateral current mirror current source in which approximately one microams of current continuously passes through collector 364 of transistor 366 to ground node 208. Consequently, collector 364 continuously sinks approximately one microamp of current from collectors 358 and 362 of transistors 308 and 340, respectively. Bilateral pnp transistor device 392 facilitates turn-off of transistors 292 and 296. In facilitating turn-off of transistors 292 and 296, bilateral bipolar pnp transistor device 392 conducts current in either direction between Node B and capacitor 342, thereby requiring that capacitor 342 conduct more than approximately one microamp of current in order to satisfy the current requirements of bilateral bipolar pnp transistor device 392 and to appropriately control bases 330 and 332 of transistors 292 and 296, respectively, such that the required capacitance of capacitor 342 is greater than the required capacitances of capacitors 186 and 192 of FIG. 2.

If voltage at Node B is at least one $V_{be}$ higher than voltage at base 332 of transistor 296, then transistor 296 is turned on; the bilateral pnp transistor devise 392 provides turn-off current between emitter 294 and base 332 of transistor 296, with transistor 300 providing turn-off current for transistor 296 based upon the current mirror relationship between transistors 300 and 308. If Node B has a voltage at least one $V_{be}$ less than base 330 of transistor 292, then transistor 292 is turned on; the bilateral pnp transistor device 392 provides turn-off current between base 330 and emitter 290 of transistor 292, with transistor 304 providing turn-off current for transistor 292 based upon the current mirror relationship between transistors 304 and 340.

The bilateral pnp transistor device 392 operates in a manner consistent with capacitor 342, which bidirectionally conducts current through bases 332 and 330 of transistors 296 and 292, respectively. The bilateral pnp transistor device 392 assists in minimizing a voltage difference between Node B and capacitor 342, thereby limiting delays between a voltage transition at input terminal 200 and a resulting feedback control current through transistors 292 or 296. The npn current mirror formed by transistors 374 and 366 continuously sinks approximately one microamp of current through collector 364 of transistor 366, thereby providing current bias for bilateral pnp transistor device 392 to provide turn-off currents for transistors 292 and 296.

Figure 4A:
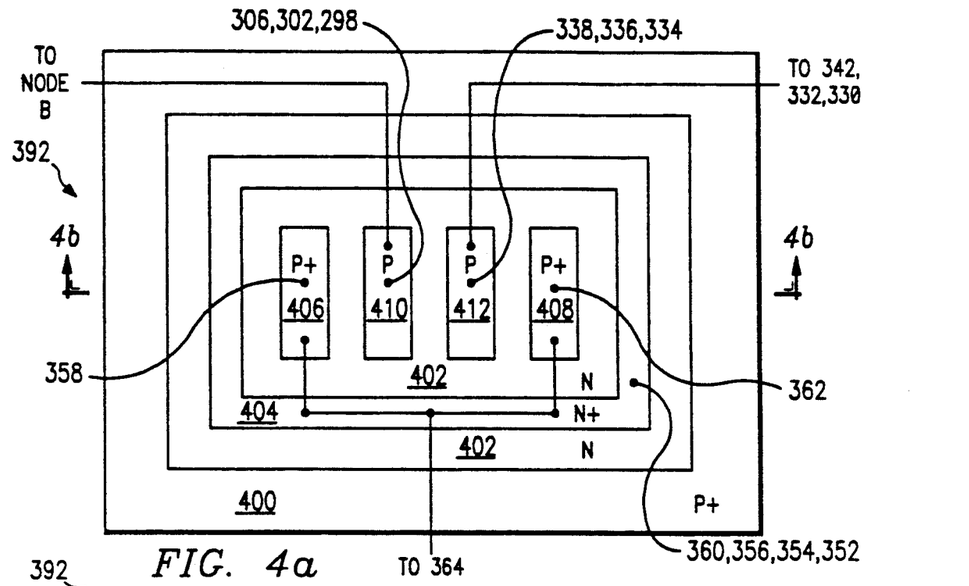
FIGS. 4a-b illustrate respective plan and sectional views of a bilateral bipolar transistor of the second illustrative embodiment of circuitry for controlling rise and fall times of voltage in an electronic circuit.
Figure 4B:
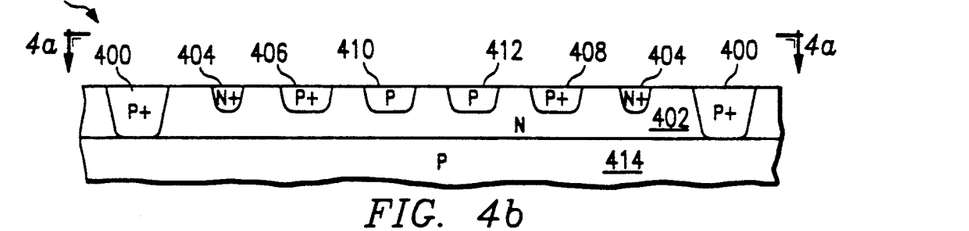

FIGS. 4a-b illustrate respective plan and sectional views of the bilateral bipolar pnp transistor device 392 of FIG. 3. In FIG. 4a, a P+ diffused region 400 isolates the bilateral pnp transistor device 392 from adjacent circuitry on an integrated circuit. N type epitaxial semiconductor layer 402 provides a base for the bilateral pnp transistor device 392. N+ region 404 provides a contact region for N type epitaxial semiconductor layer 402 and also serves as a guard ring by limiting lateral current flow to P+ diffused region 400. N+ region 404 is coupled to P+ region 406, P+ region 408, and collector 364 (FIG. 3) of transistor 366. P type region 410 provides a contact region to Node B (FIG. 3). P type region 412 provides a contact region to capacitor 342, to base 332 of transistor 296, and to base 330 of transistor 292 (all of FIG. 3). Metal contacts to semiconductor regions 404-412 are shown only schematically for clarity. FIG. 4b illustrates a sectional view of the bilateral pnp transistor device 392 of FIG. 4a, taken substantially along line 4b—4b of FIG. 4a. As FIG. 4b illustrates, the N type epitaxial semiconductor layer 402 is formed over P type semiconductor substrate 414.

The bilateral pnp transistor device 392 of FIGS. 4a-b occupies layout area within an integrated circuit comparable to the layout area required by two typical pnp transistors, yet the bilateral pnp transistor device 392 of FIGS. 4a-b performs the functions of four pnp transistors 300, 304, 308, and 340 illustrated in FIG. 3. In FIG. 4a, N+ region 404 implements the functions of base 360 of transistor 340, base 356 of transistor 308, base 354 of transistor 304, and base 352 of transistor 300. P+ region 406 implements the function of collector 358 of transistor 308. P region 410 implements the functions of emitter 306 of transistor 308, collector 302 of transistor 304, and emitter 298 of transistor 300. P region 412 implements the functions of emitter 338 of transistor 340, emitter 336 of transistor 304, and collector 334 of transistor 300. P+ region 408 implements the function of collector 362 of transistor 340. As FIG. 4a illustrates, collector 358 (P+ region 406) is coupled to base 356 (N+ region 404) of transistor 308. Also, collector 362 (P+ region 408) is coupled to base 360 (N+ region 404) of transistor 340.

When P region 410 has a voltage of approximately one $V_{be}$ less than P region 412, the functions of transistor 340 are implemented by P region 412 (emitter 338), N type epitaxial material 402 and N+ material 404 (base 360), and P+ material 408 (collector 362), and the functions of transistor 304 are implemented by P region 412 (emitter 336), N type epitaxial material 402 and N+ material 404 (base 354), and P region 410 (collector 302). When P region 410 has a voltage of approximately one $V_{be}$ more than P region 412, the functions of transistor 308 are implemented by P region 410 (emitter 306), N type epitaxial material 402 and N+ material 404 (base 356), and P+ material 406 (collector 358), and the functions of transistor 300 are implemented by P region 410 (emitter 298), N type epitaxial material 402 and N+ material 404 (base 352), and P region 412 (collector 334).

Figure 5:
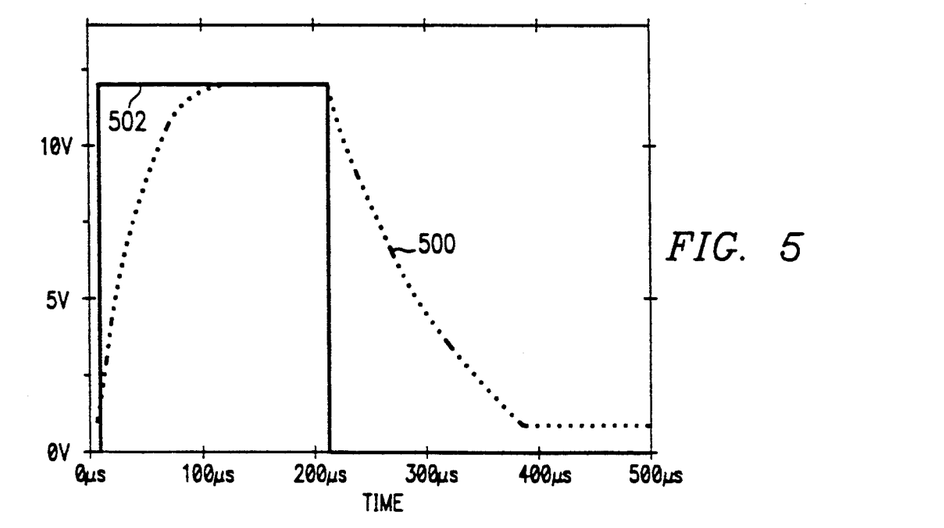
FIG. 5 illustrates a graph showing a voltage output by the first illustrative embodiment of circuitry for controlling rise and fall times of voltage in an electronic circuit, in response to a voltage input.

FIG. 5 illustrates a graph showing a voltage output 500 produced by the circuitry of FIG. 2 under an operating condition of 25° Celsius in response to a voltage input 502. As FIG. 5 illustrates, voltage input 502 abruptly increases from zero volts to approximately twelve volts at time=approximately 12.5 microseconds, and voltage input 502 abruptly decreases from approximately twelve volts to zero volts at time=approximately 212.5 microseconds. Voltage output 500 is significantly delayed relative to voltage input 502, as voltage output 500 fails to increase to approximately twelve volts until time=approximately 100 microseconds. Moreover, voltage output 500 begins decreasing at time=approximately 212.5 microseconds, yet requires approximately 175 microseconds to decrease to approximately one volt at time=approximately 387.5 microseconds. Hence, a rise time delay of approximately 100 microseconds and a fall time delay of approximately 175 microseconds are achieved.

Figure 6A:
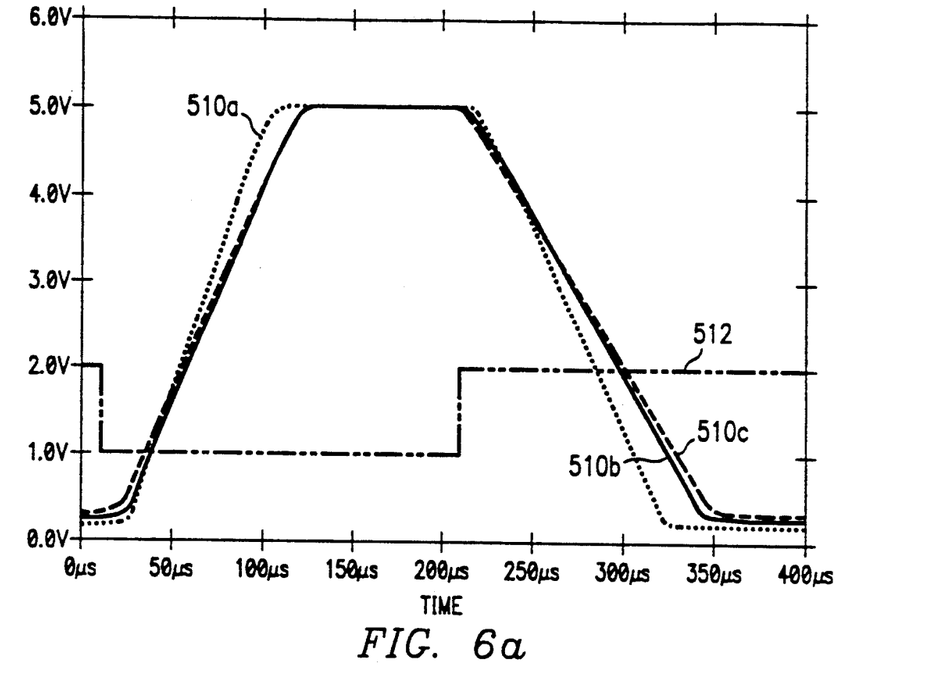
FIGS. 6a-b illustrate graphs showing voltages output by the second illustrative embodiment of circuitry for controlling rise and fall times of voltage in an electronic circuit, in response to a voltage input.

FIG. 6a illustrates a graph showing voltage outputs 510a-c produced by the circuitry of FIG. 3 under operating conditions of high (approximately two times normal) transistor $\beta$ values, high (approximately 1.2 times normal) resistor values, and a high (approximately 1.1 times normal) capacitor value, all tending to slow the responses of voltage outputs 510a-c in response to a transition of voltage input 512. Voltage outputs 510a-c have inverted logic states relative to voltage input 512. The circuitry of FIG. 3 produces voltage output 510a under an operating condition of approximately −40° Celsius, voltage output 510b under an operating condition of approximately 85° Celsius, and voltage output 510c under an operating condition of approximately 150° Celsius. As FIG. 6a illustrates, a rise time delay of approximately 90-100 microseconds is achieved between time=approximately 10 microseconds (when a transition of voltage input 512 occurs) and time=approximately 100-110 microseconds (when voltage outputs 510a-c transition to five volts). Moreover, a fall time delay of approximately 110-140 microseconds is achieved between time=approximately 210 microseconds (when a transition of voltage input 512 occurs) and time=approximately 320-350 microseconds (when voltage outputs 510a-c transition to approximately zero volts).

Figure 6B:
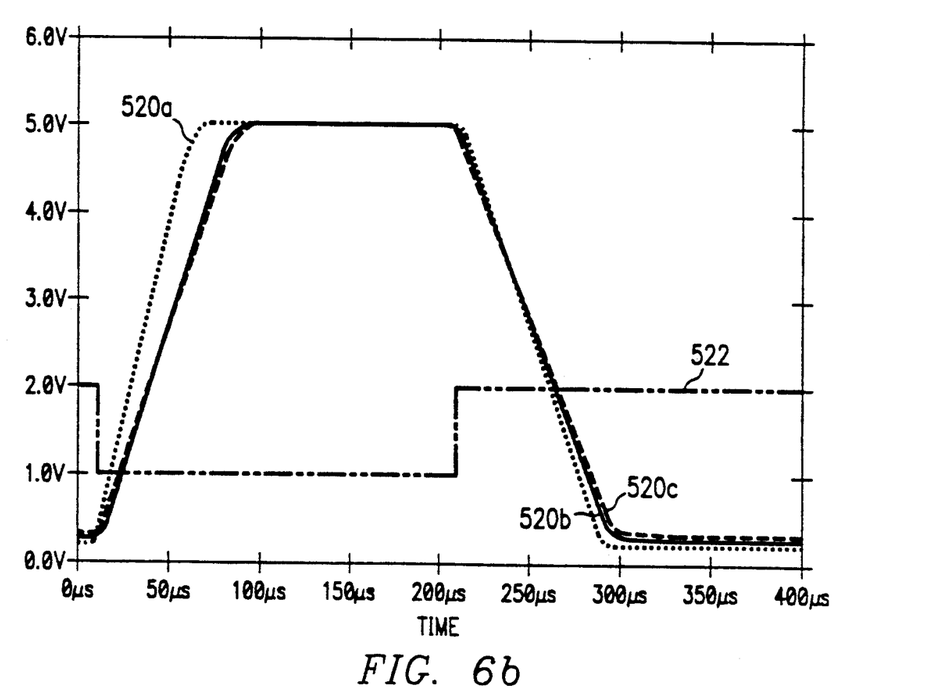

FIG. 6b illustrates a graph showing voltage outputs 520a-c produced by the circuitry of FIG. 3 under operating conditions of low (approximately one-half times normal) transistor $\beta$ values, low (approximately 0.8 times normal) resistor values, and a low (approximately 0.9 times normal) capacitor value, all tending to speed the responses of voltage outputs 520a-c in response to a transition of voltage input 522. The circuitry of FIG. 3 produces voltage output 520a under an operating condition of approximately −40° Celsius, voltage output of 520b under an operating condition of approximately 85° Celsius, and voltage output 520c under an operating condition of approximately 150° Celsius. As FIG. 6b illustrates, a rise time delay of approximately 50-70 microseconds is achieved between time=approximately 10 seconds (when a transition of voltage input 522 occurs) and time=approximately 60-80 microseconds (when voltage outputs 520a-c transition to five volts). Moreover, a fall time delay of approximately 80-90 microseconds is achieved between time=approximately 210 microseconds (when a transition of voltage input 522 occurs) and time=approximately 290-300 microseconds (when voltage outputs 520a-c transition to approximately zero volts).

In FIG. 3, the larger size of sense capacitor 342, relative to sense capacitors 186 and 192 of FIG. 2, is a slight shortcoming if integrated circuit area is a controlling factor. However, the higher capacitance of sense capacitor 342 produces more consistent rise and fall times despite variations in amplification transistor $\beta$ values, because sense capacitor 342 diminishes the contribution of amplification transistor $\beta$ values toward overall current gain in driver circuitry 198 of FIG. 3 relative to driver circuitry 98 of FIG. 2. Moreover, when compared against circuitry 98 of FIG. 2, the circuitry 198 of FIG. 3 is less subject to oscillation in the falling region of its voltage output waveform, because the larger capacitance of sense capacitor 342 produces a larger current through amplification transistor 296, thereby enabling amplification transistor 296 to appropriately control current at base 286 of transistor 288 without using an additional amplification transistor to further amplify the control current, whereas sense capacitor 186 of FIG. 2 requires both amplification transistors 164 and 154 to sufficiently control current at base 122 of modification transistor 124 in the falling region of the voltage output waveform. Furthermore, the larger capacitance of sense capacitor 342 provides minimum rise and fall time delays of approximately fifty microseconds even though $V_{cc}$ 220 has a voltage of only approximately five volts, whereas $V_{cc}$ 112 of FIG. 2 has a higher voltage of approximately twelve volts for minimum rise and fall time delays of approximately fifty microseconds.

Relative to circuitry 98 of FIG. 2, the circuitry 198 of FIG. 3 produces more consistent rise and fall time delays despite variations in temperature. Typically, higher temperatures increase junction leakages between a transistor's collector and its base, thereby negatively impacting external attempts to control the transistor by adjusting current at the transistor's base. This problem is addressed in circuitry 198 of FIG. 3 by providing a constant turn-off current for transistors 296 and 292 using the bilateral pnp transistor device 392 comprising transistors 300, 304, 308, and 340. If transistors 300 and 308 are turned on, then the bilateral pnp transistor device 392 continuously sinks approximately one microamp of current from emitter 294 of amplification transistor 296, thereby providing turn-off current for amplification transistor 296. If transistors 304 and 340 are turned on, then the bilateral pnp transistor device 392 continuously sinks approximately one microamps of current from base 330 of amplification transistor 292, thereby providing turn-off current for amplification transistor 292. Thus, if less than approximately one microamp of current passes through sense capacitor 342, then the bilateral pnp transistor device 392 provides a quick turn-off for amplification transistors 296 and 292. The one microamp turn-off current provided by the bilateral pnp transistor device 392 is greater than the expected current leakages in a typical transistor. The larger capacitance of sense capacitor 342 is required in part because sense capacitor 342 preferably conducts sense current beyond the one microamps turn-off current provided by the bilateral pnp transistor device 392. The quick turn-off provided by the bilateral pnp transistor device 392 also diminishes oscillation in the falling region of the voltage output waveform.

The rise time delay produced by circuitry 198 of FIG. 3 may be independently adjusted by modifying the transistor $\beta$ value of amplification transistor 292, and the fall time delay may be independently adjusted by modifying the transistor $\beta$ value of amplification transistor 296; moreover, the rise and fall time delays may be jointly adjusted by modifying the capacitance of sense capacitor 342. Similarly, the rise time delay produced by the circuitry of FIG. 2 may be adjusted either by modifying the transistor $\beta$ value of amplification transistor 150 or by modifying the capacitance of sense capacitor 192. The fall time delay produced by the circuitry of FIG. 2 may be adjusted either by modifying the transistor $\beta$ values of amplification transistors 164 and 154 or by modifying the capacitance of sense capacitor 186.

Although the present invention and its advantages have been described in detail, it should be understood that various changes, substitutions and alterations can be made herein without departing from the spirit and scope of the invention as defined by the appended claims.

What is claimed is:

1. Circuitry for controlling voltage in an electronic circuit, comprising:
    an output node having an output voltage;
    sensing circuitry coupled to said output node for sensing a rate of change in said output voltage and outputting a signal in response thereto, wherein said sensing circuitry further comprises at least one capacitor for conducting an electrical sense current, each said capacitor having a first and second electrode, said first electrode coupled to said output node, wherein said capacitor is operable to sense that said rate of change is positive by conducting a first sense current away from said output node, and is further operable to sense that said rate of change is negative by conducting a second sense current toward said output node;
    amplification circuitry coupled to said sensing circuitry for receiving said signal and outputting an amplified signal in response thereto, wherein said amplification circuitry further comprises first and second amplification transistors each having a collector, an emitter, and a base, wherein said bases are coupled to said second electrode, and wherein said first and second amplification transistors are operable to amplify said first and second sense currents, respectively; and
    modification circuitry coupled between said amplification circuitry and said output node for receiving said amplified signal and modifying said rate of change in response to said amplified signal.

2. The circuitry of claim 1 wherein said signal comprises an electrical current and wherein said amplification circuitry comprises at least one amplification transistor for amplifying said electrical current.

3. The circuitry of claim 2 wherein said amplification transistor comprises a bipolar transistor having a base, a collector, and an emitter, wherein said base is coupled to said sensing circuitry.

4. The circuitry of claim 1 wherein said modification circuitry comprises at least one modification transistor for outputting a modification control current to modify said rate of change in response to an amplified electrical current forming said amplified signal.

5. The circuitry of claim 4 wherein said modification transistor comprises a bipolar transistor having a base coupled to said amplification circuitry for receiving said amplified electrical current.

6. The circuitry of claim 5 wherein said modification circuitry further comprises an output transistor coupled between said modification transistor and said output node and operable to modify said rate of change in response to said modification control current received at a base of said output transistor.

7. The circuitry of claim 1 and further comprising turn off circuitry coupled between said base and said emitter of said first amplification transistor, between said base and said emitter of said second amplification transistor, and between said capacitor and said modification circuitry, said turn off circuitry being operable to conduct a turn off current between said base and said emitter of said first amplification transistor away from said output node and between said base and said emitter of said second amplification transistor toward said output node.

8. The circuitry of claim 7 wherein said turn off circuitry comprises a first current mirror pair of bipolar transistors operable to conduct a turn off current between said base and said emitter of said first amplification transistor away from said output node, and further comprises a second current mirror pair of bipolar transistors operable to conduct a turn off current between said base and said emitter of said second amplification transistor toward said output node.

9. The circuitry of claim 8 wherein said first current mirror pair is coupled between said base and said emitter of said first amplification transistor and between said base and said emitter of said second amplification transistor, wherein said first current mirror pair comprises first and second bipolar transistors each having a base, a collector, and an emitter, said base of said first bipolar transistor being coupled to said base of said second bipolar transistor, said emitter of said first bipolar transistor being coupled to said emitter of said second bipolar transistor, and said base of said second bipolar transistor being coupled to said collector of said second bipolar transistor.

10. The circuitry of claim 9 wherein said second current mirror pair is coupled between said base and said emitter of said first amplification transistor and between said base and said emitter of said second amplification transistor, wherein said second current mirror pair comprises third and fourth bipolar transistors each having a base, a collector, and an emitter, said base of said third bipolar transistor being coupled to said base of said fourth bipolar transistor and to said base of said first bipolar transistor, said emitter of said third bipolar transistor being coupled to said emitter of said fourth bipolar transistor and to said collector of said first bipolar transistor, and said base of said fourth bipolar transistor being coupled to said collector of said fourth bipolar transistor.

11. The circuitry of claim 1 wherein said sensing circuitry comprises:
    a first capacitor operable to sense that said rate of change is positive by conducting a first electrical sense current away from said output node; and
    a second capacitor operable to sense that said rate of change is negative by conducting a second sense current toward said output node.

12. The circuitry of claim 1 wherein said first amplification transistor comprises a first bipolar transistor having a base coupled to said first capacitor, and wherein said second amplification transistor comprises a second bipolar transistor having a base coupled to said second capacitor.

13. Circuitry for controlling voltage in an electronic circuit, comprising:
   an output node having an output voltage;
   sensing circuitry comprising a capacitor having first and second electrodes, wherein said first electrode is coupled to said output node, said capacitor being operable to sense that said rate of change is positive by conducting a first sense current away from said output node, and said capacitor being operable to sense that said rate of change is negative by conducting a second sense current toward said output node;
   amplification circuitry comprising a first amplification transistor having a base coupled to said second electrode and operable to amplify said first sense is current, and further comprising a second amplification transistor having a base coupled to said second electrode and operable to amplify said second sense current; and
   modification circuitry coupled to said output node and comprising a modification transistor having a base coupled to said first and second amplification transistors and operable to modify said rate of change based upon said first and second amplified sense currents.

14. The circuitry of claim 13 wherein said modification transistor is operable to modify said rate of change by modifying an electrical modification current.

15. The circuitry of claim 14 wherein said modification circuitry further comprises an output transistor coupled between said modification transistor and said output node and operable to modify said rate of change based upon said electrical modification current.

16. Circuitry for controlling voltage in an electronic circuit, comprising:
   an output node having an output voltage;
   sensing circuitry, comprising first and second capacitors each having respective first and second electrodes, wherein each said first electrode is coupled to said output node, said first capacitor being operable to sense that said rate of change is positive by conducting a first sense current away from said output node, and said second capacitor being operable to sense that said rate of change is negative by conducting a second sense current toward said output node;
   amplification circuitry comprising a first amplification transistor having a base coupled to said is second electrode of said first capacitor and operable to amplify said first sense current, and further comprising a second amplification transistor having a base coupled to said second electrode of said second capacitor and operable to amplify said second sense current; and
   modification circuitry coupled to said output node and comprising a pair of modification transistor having their bases connected to said first and second amplification transistors and operable to modify said rate of change based upon said first and second amplified sense currents.

17. The circuitry of claim 16 wherein said amplification circuitry further comprises a third amplification transistor having a base coupled to said second amplification transistor and having an electrode coupled to said modification transistor, said base for receiving said second amplified sense current and operable to further amplify said second amplified sense current provided to said base of said modification transistor.

18. A method of controlling voltage in an electronic circuit, comprising the steps of:
   sensing a rate of change in an output voltage of an output node coupled to sensing circuitry;
   outputting a signal from said sensing circuitry in response to said sensed rate of change;
   receiving said signal at amplification circuitry coupled to said sensing circuitry;
   outputting an amplified signal from said amplification circuitry in response to said signal;
   receiving said amplified signal at modification circuitry coupled between said amplification circuitry and said output node;
   outputting a modification signal from said modification circuitry to modify said rate of change in response to said amplified signal, said modification signal comprising a modification control current; and
   receiving said modification control current at a base of an output transistor for modifying said rate of change in response to said modification control current, said output transistor being coupled between said modification circuitry and said output node.

19. The method of claim 18 wherein said signal outputting step comprises the step of outputting an electrical current, said signal receiving step comprises the step of receiving said electrical current at said amplification circuitry, and said amplified signal outputting step comprises the step of outputting an amplified electrical current from said amplification circuitry in response to said electrical current.

20. The method of claim 19 wherein said amplified electrical current outputting step comprises the step of receiving said electrical current at a base of an amplification bipolar transistor.

21. The method of claim 18 wherein said modification signal outputting step comprises the step of outputting said modification signal comprising a modification control current to modify said rate of change in response to an amplified electrical current forming said amplified signal.

22. The method of claim 21 wherein said modification control current outputting step comprises the step of receiving said amplified electrical current at a base of a modification bipolar transistor.

23. The method of claim 18 wherein said sensing step comprises the step of conducting an electrical sense current through at least one capacitor having a first electrode coupled to said output node and a second electrode coupled to said amplification circuitry.

24. The method of claim 23 wherein said sensing step comprises the steps of:
   sensing that said rate of change is positive by conducting a first sense current through said capacitor away from said output node; and
   sensing that said rate of change is negative by conducting a second sense current through said capacitor toward said output node.

25. The method of claim 24 wherein said amplification step comprises the steps of:

receiving said first sense current at a base of a first amplification transistor;

receiving said second sense current at a base of a second amplification transistor;

amplifying said first sense current using said first amplification transistor; and amplifying said second sense current using said second amplification transistor.

26. The method of claim 25 and further comprising the steps of:

conducting a first turn off current away from said output node between an emitter and said base of said first amplification transistor; and conducting a second turn off current toward said output node between an emitter and said base of said second amplification transistor.

27. The method of claim 26 wherein said first turn off current conducting step comprises the step of conducting said first turn off current through a first current mirror pair of bipolar transistors, and wherein said second turn off current conducting step comprises the step of conducting said second turn off current through a second current mirror pair of bipolar transistors.

28. The method of claim 27 wherein said first turn off current conducting step comprises the step of conducting said first turn off current through said first current mirror pair coupled between said base and said emitter of said first amplification transistor and between said base and said emitter of said second amplification transistor.

29. The method of claim 28 wherein said second turn off current conducting step comprises the step of conducting said second turn off current through said second current mirror pair coupled between said base and said emitter of said first amplification transistor and between said base and said emitter of said second amplification transistor.

30. The method of claim 23 wherein said sensing step comprises the steps of:

sensing that said rate of change is positive by conducting a first sense current through a first capacitor away from said output node; and sensing that said rate of change is negative by conducting a second sense current through a second capacitor toward said output node.

31. The method of claim 30 wherein said amplification step comprises the steps of:

amplifying said first sense current using a first amplification transistor; and amplifying said second sense current using a second amplification transistor.

32. The method of claim 31 wherein said amplification step further comprises the steps of:

receiving said first sense current at a base of said first amplification transistor; and receiving said second sense current at a base of said second amplification transistor.

33. A method of controlling voltage in an electronic circuit, comprising the steps of:

sensing a positive rate of change in an output voltage of an output node by conducting a first sense current through a capacitor away from said output node;

sensing a negative rate of change in said output voltage by conducting a second sense current through said capacitor toward said output node;

receiving said first sense current at a base of a first amplification transistor;

receiving said second sense current at a base of a second amplification transistor;

amplifying said first sense current using said first amplification transistor;

amplifying said second sense current using said second amplification transistor;

receiving said first and second sense currents as the bases of first and second modification transistors, respectively;

modifying said rate of change using said modification transistors based upon said first and second amplified sense currents by modifying said rate of change by modifying an electrical modification current using said modification transistors; and receiving said electrical modification current at an output transistor coupled between said first modification transistor and said output node; and modifying said rate of change using said output transistor based upon said electrical modification current.

34. The method of claim 33 wherein said amplifying step further comprises the steps of:

receiving said second amplified sense current at a base of a third amplification transistor having its base coupled to said second amplification transistor and a first electrode coupled to the base of said modification transistor; and further amplifying said second amplified sense current provided to said base of said modification transistor.

* * * * *